United States Patent [19]

Mazure-Espejo et al.

[11] Patent Number: 4,885,617

[45] Date of Patent: Dec. 5, 1989

[54] METAL-OXIDE SEMICONDUCTOR (MOS) FIELD EFFECT TRANSISTOR HAVING EXTREMELY SHALLOW SOURCE/DRAIN ZONES AND SILICIDE TERMINAL ZONES, AND A PROCESS FOR PRODUCING THE TRANSISTOR CIRCUIT

[75] Inventors: C. A. Mazure-Espejo, Kirchseon; Franz Neppl, Munich, both of Fed. Rep. of Germany

[73] Assignee: Siemens Aktiengesellschaft, Berlin and Munich, Fed. Rep. of Germany

[21] Appl. No.: 110,885

[22] Filed: Oct. 21, 1987

[30] Foreign Application Priority Data

Nov. 18, 1986 [DE] Fed. Rep. of Germany ....... 3639356

[51] Int. Cl.[4] ..................... H01L 29/78; H01L 27/02; H01L 23/48
[52] U.S. Cl. ................................. 357/23.9; 357/23.1; 357/23.11; 357/41; 357/42; 357/44; 357/67; 357/71
[58] Field of Search .................... 357/23.9, 23.11, 23.1, 357/67 S, 71 S, 42, 41, 44

[56] References Cited

U.S. PATENT DOCUMENTS

| | | | |
|---|---|---|---|
| 4,041,518 | 8/1977 | Shimizu et al. | 357/23.9 |
| 4,343,082 | 8/1982 | Lepselter et al. | |
| 4,419,810 | 12/1983 | Riseman | 357/23.9 |
| 4,452,580 | 9/1985 | Delivorias | |
| 4,566,914 | 1/1986 | Hall | |
| 4,621,276 | 11/1986 | Malhi | 357/23.9 |
| 4,642,878 | 2/1987 | Maeda | 357/42 |
| 4,737,831 | 4/1988 | Iwai | 357/23.9 |
| 4,797,718 | 1/1989 | Schubert | 357/23.9 |

FOREIGN PATENT DOCUMENTS

| | | | |
|---|---|---|---|
| 54-881 | 1/1979 | Japan | 357/23.11 |
| 54-114187 | 9/1979 | Japan | 357/23.9 |
| 55-43885 | 3/1980 | Japan | 357/23.11 |

OTHER PUBLICATIONS

"Selective Epitaxy for CMOS VLSI" by K. A. Sabine et al, IEEE Electron Device Letters, vol. EDL-6, No. 1, Jan. 1985, pp. 43-46.

"Solid: High-Voltage, High-Gain 300 nm Channel-Length MOSFETS I. Simulation", by Horiuchi et al, Solid State Electronics, vol. 28, No. 5, 1985, pp. 465-472.

"Application of Selective Silicon Epitaxial Growth for CMOS Technology" by S. Nagao et al, LSI R & D Lab, Mitsubishi Electric Corp., IEDM, 1984, pp. 593-596.

"Titanium Disilicide Self-Aligned Source/Drain+Gate Technology" by C. K. Lau et al, VLSI Laboratory/Semiconductor Group CMOS Division, IEEE, 1982, pp. 714-717.

Primary Examiner—Andrew J. James
Assistant Examiner—Ngan Van Ngo
Attorney, Agent, or Firm—Hill, Van Santen, Steadman & Simpson

[57] ABSTRACT

A metal-oxide-semiconductor (MOS) field effect transistor comprises monocrystalline, doped silicon zones which are formed between gate electrodes and the field oxide zones by selective epitaxy and which simultaneously serve as diffusion sources for the formation of source and drain zones in the substrate and as terminal zones for silicide source and drain terminals. This terminal technology serves to form particularly planar structures, with a high integration density, which structures are characterized by reduced drain field strength, low series resistances and a small danger of substrate short circuits. Processes for the formation of this structure in CMOS circuits are simple to perform. The present invention can be applied to all NMOS, PMOS and CMOS circuits.

5 Claims, 4 Drawing Sheets

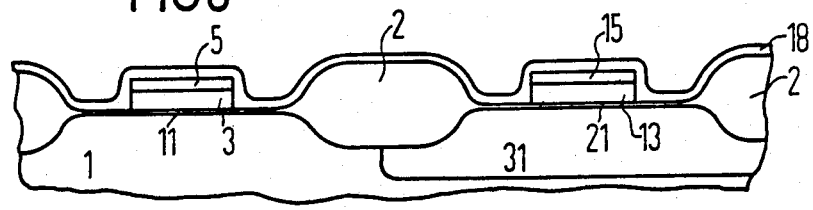
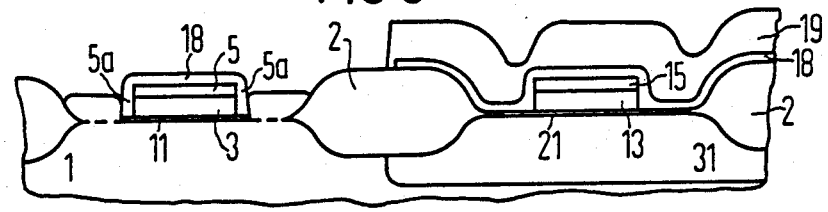
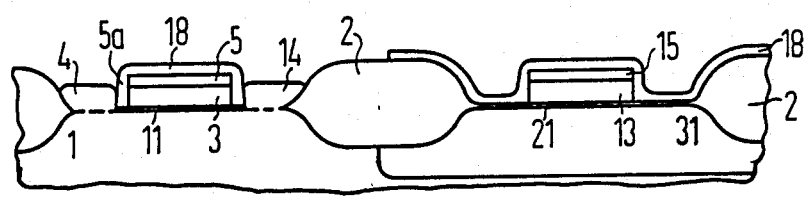
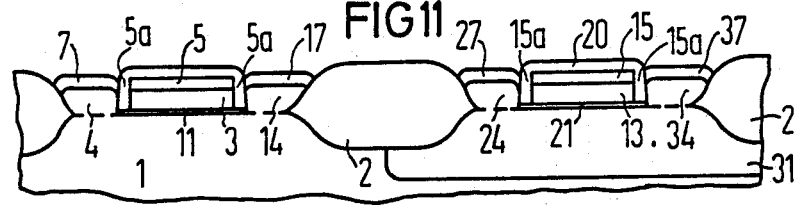
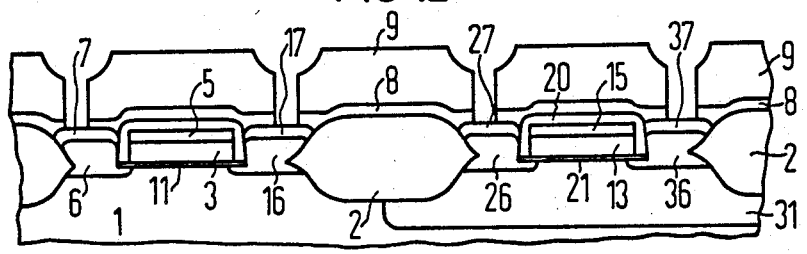

METAL-OXIDE SEMICONDUCTOR (MOS) FIELD EFFECT TRANSISTOR HAVING EXTREMELY SHALLOW SOURCE/DRAIN ZONES AND SILICIDE TERMINAL ZONES, AND A PROCESS FOR PRODUCING THE TRANSISTOR CIRCUIT

BACKGROUND OF THE INVENTION

1. Field of the Invention

The present invention relates to a metal-oxidesemiconductor (MOS) field effect transistor structure, formed between field oxide zones of an integrated circuit, with extremely shallow source/drain zones in the silicon substrate and self-aligned source/drain terminals composed of silicide, and a gate electrode which is separated by an insulating layer from the substrate. The gate electrode located between the source/drain zones is provided with a side-wall oxide. The invention further relates to highly-integrated circuits (IC's), containing complementary-metal-oxide-semiconductor (CMOS) transistors, with field oxide zones which separate the active transistor zones, with extremely source/drain zones in the substrate, with selfaligned source/drain terminals composed of silicide, and with gate electrodes located between the source/drain zones of the n-channel and p-channel transistors, so as to be insulated from the substrate, and which are provided with side-wall oxides. The invention further relates to the process for the product of said circuits.

2. Description of the Prior Art

The further miniaturisation of MOS-ICs has resulted in increased problems in respect of parasitic series resistances, drain field strengths (so-called hot carrier effects) and planarisation. Prior to the contact hole etching, the planarisation is particularly restricted due to the number of different contact hole depths which would otherwise occur and due to the limited selectivity of the etching process to the substrate.

For the reduction of the drain field strengths, so-called lightly, doped drain (LDD) techniques are in widespread use, which, however, result in considerable series resistances. Therefore, in order to overcome the problem of the series resistances of the so-called SALICIDE techniques (self-aligned silicide techniques), as described, for example, in a report by C. K. Lau, Y. C. See, D. B. Scott, J. M. Bridges, S. M. Perna and R. D. Davis in the IEDM Technical Digest, 1982, pp. 714–777 and a combination of self-aligned siliciding (deposition of metal onto silicon surfaces) with the lightly-doped-drain technique have been proposed. This technique is known as the so-called SOLID technique (silicide on lightly doped drain) and is disclosed in a report by M. Horiuchi and K. Yamaguchi in the publication "Solid State Electronics", Vol. 28, 1985, pp. 465–472.

The disadvantage of all these techniques is that the previously-produced diffusion zones, which are necessarily shallow because of the short-channel properties, are, in part, consumed as a result of the silicide reaction. As a result there is a high risk of substrate short-circuits, in particular in the case of non-homogeneous reactions.

SUMMARY OF THE INVENTION

The object of the invention is to provide a MOS-field effect transistor structure wherein the technology of the known processes is improved in such a manner that, in spite of the shallow source/drain zones, it is possible to carry out siliciding in order to reduce the layer resistances without the occurrence of substrate short-circuits. Furthermore, a structure is to be produced which is as planar as possible and which is suitable for multilayer wiring, where the contact hole etching, and therefore the selectivity of this etching to the substrate, is not critical.

The above object is achieved by providing a MOS-field effect transistor structure which is formed between field oxide zones of an integrated circuit, with extremely shallow source/drain zones and the silicon substrate and with self-aligned source/drain terminals composed of silicide and with a gate electrode which is separated from the substrate by an insulating layer, located above the channel zone and between the source/drain zones and provided with side-wall oxides, which is particularly characterized in that, between the gate electrode and the field oxide zones are provided grown monocrystalline, doped silicon layers which are formed by selective epitaxy and which themselves form (a) the diffusion sources for the production of the source/drain zones in the substrate and (b) the terminal zones to the overlying source/drain terminals which consist of silicide.

The use of selected epitaxy results in a preplanarisation of the transistor structure which is linked with a series of device advantages. The use of selective silicon epitaxy is described in the context of CMOS-technology, for example, in an article by S. Nagao, K. Higashitani, Y. Akasaka and H. Nakata in the publication "Technical Digest IEDM", 1984, pp. 593–596, wherein the selective epitaxy is used to fill trenches, etched into insulating layers, with monocrystalline silicon and to improve the LOCOS insulating technology by the suppression of so-called bird's beaks.

Another process of selective silicon epitaxy for highly-integrated CMOS-circuits is described in an article by K. A. Sabine and H. A. Kemhadjian in the publication "IEEE Electron Device Letters", Vol. EDL-6, 1985, pp. 43–46. Here, the selective epitaxy serves to fill wells etched into silicon substrates, with monocrystalline, correspondingly doped silicon layers, in order to obtain defined well zones with low surface concentrations, lower layer resistances and negligible lateral diffusion.

In contrast to the known MOS and CMOS-structures, the structures, the structure in accordance with the present invention has the advantage that the homogeneous filling of the zones between gate and field oxide with monocrystalline silicon, where the gate surfaces remain covered with oxide and are excluded from the later siliciding, causes the new source/drain formation to be largely decoupled from the gate zone as a result of the optimisation of the source/drain contacts. The following improvements and possibilities are thereby obtained:

1. As a source/drain implantation takes place in the epitaxially grown silicon layer, no implantation damages occasioned at the gate edge. This preserves the quality of the gate oxide and avoids possible sources of degradation.
2. In the case of standard diffusion time products (D.t), as a result of the diffusion out of the highly-doped epitaxial source/drain zone, very shallow, effective diffusion zones can be achieved in the substrate. Smaller sub-threshold currents and reduced punch-through effects must therefore be expected in the anti-punch channel implantation steps a lower dose is required. This leads to a reduction of the junction capacitance. The relatively low doping of the diffused-out source/drain zone reduces the drain field strength at the gate edge, which represents one of the most important sources of degradation.

3. The combination of a self-aligned silicide technique (SALICIDE technique) effects the parasitic series resistances. Siliciding can be carried out in spite of the shallow, effective diffusion zones. The danger of substrate short-circuits together with the possibility of inhomogeneous silicide reactions, is prevented by the epitaxial layer which, in spite of the shallow, effective diffusion zones, serves as a buffer layer. As a result, higher silicide thicknesses are possible in order to achieve lower resistances.

4. The epitaxially grown source/drain zones provide improved conditions for planarisation and multilayer wiring. The limitation in the flow process using boron-phosphorous silicate glass is reduced. Consequently, the demands on the selectivity of the contact hole etching are reduced. The interval between contact hole and field oxide edge becomes non-critical as the danger of substrate short-circuits no longer exists.

5. As a result of the shallow source/drain diffusion in the substrate, a reduced latch-up sensitivity is to be expected independently of the well dopings and depths. The reason for this is the higher Gummel number and the increase in the parasitic emitter-collector breakdown voltage $U_{CEO}$.

Further developments of the invention, in particular processes for the formation of the MOS or CMOS-structure in integrated circuits, are described below.

In the following, the MOS-field effect transistor structure in accordance with the present invention, and processes for the production thereof in an integrated circuit will be explained in detail with respect to the drawings.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 8–12 are sectional views of a semi-conductor structure showing the basic process steps in the production of a CMOS-circuit, wherein the doping of the respective channel type is carried out at the time of the epitaxial deposition.

Idential components in the drawings have been provided with like reference characters.

DESCRIPTION OF THE PREFERRED EMBODIMENTS

Figure 1:
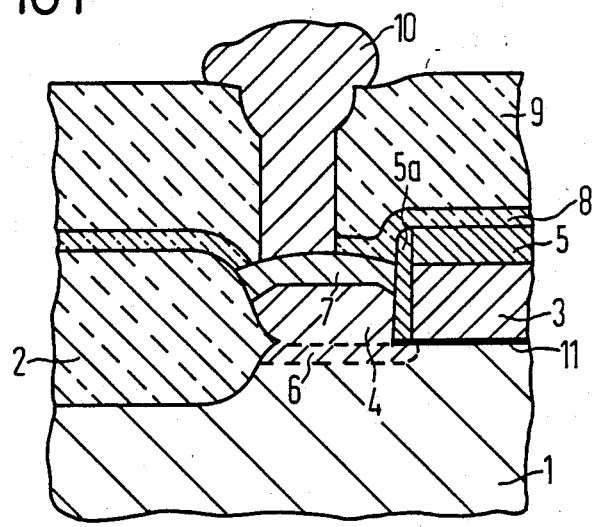
FIG. 1 is a sectional view through a portion of a MOS-field effect transistor structure, which clarifies the construction of the layers.

Referring to FIG. 1, up to the point of the formation of the metal deposition for the silicide terminal in the source/drain zones, the process for the production of the structure in accordance with the present invention proceeds in accordance with a self-aligned silicide process (see the report by C. K. Lau et al), wherein the gate electrode 3 remains excluded from the siliciding and as a result of the deposited oxide layer 5, 5a and the source/drain ion implantation has not yet been carried out. Then an undoped, epitaxial (therefore monocrystalline) silicon layer 4 is selectively deposited onto the source/drain zones 6 of the substrate 1, which have already been exposed by etching, whereby the silicon layer 4 fills the zone between the gate electrode 3 (with sidewall oxide 5a) and the field oxide 2. As a result of the selective epitaxy, the filling 4 of the source/drain zones is extremely homogeneous and monocrystalline. A bevel formation at the edge of the source and drain zone 4, an effect of selective epitaxy, in this case does not represent an obstacle because it does not affect the active transistor zone. Furthermore, the purity of the surfaces is of primary importance for contacting. Following the deposition of the epitaxial layer 4, the doping atoms of the source/drain zone 6 are implanted into the monocrystalline silicon zone 4 and diffused to such an extent that the p/n-junctions to the substrate 1 (and the troughs) lie only just within the original monosilicon 1 (see the zone 6). The silicide terminal 7, an intermediate oxide layer 8, a boron-phosphorus-glass layer 9, the outer conductor path composed of an aluminum/silicon/titanium-alloy 10, and the gate oxide 11 are illustrated.

Figure 2:
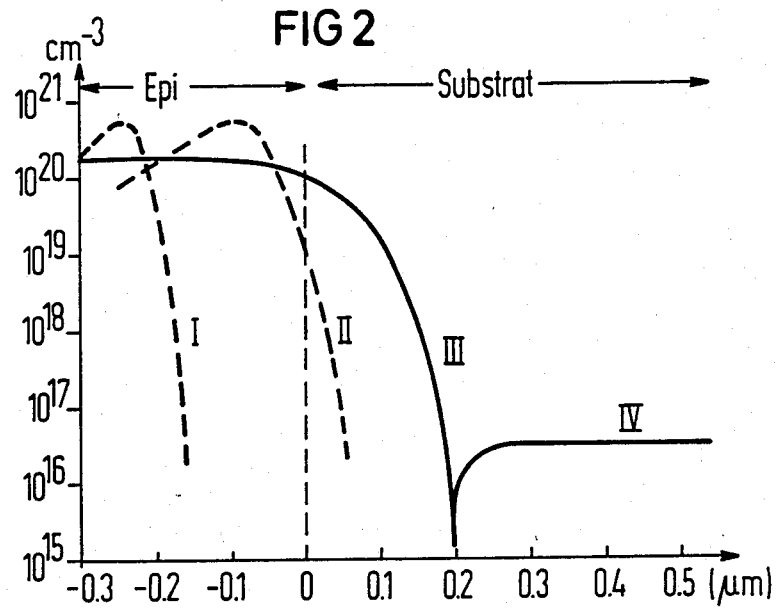
FIG. 2 is a graphic illustration showing the doping profile which prevails in the epitaxial layer and in the substrate.

Referring to FIG. 2, the doping concentration profile (ordinate=concentration in cm$^{-3}$, abscissa=penetration depth in $\mu$m) obtained for an n+ source and drain zone is illustrated. With standard diffusion-time products (D.t), source/drain zones 6 are formed which effectively are extremely shallow and which have a relatively low doping concentration and which are important for good short-channel properties (e.g. $U_T(L)$, so-called hot carriers). In FIG. 2, the curves I and II indicate phosphorous doping profiles following double implantation, while the curve III represents the phosphorous doping profile following a hightemperature step and curve IV represents the boron doping profile in the substrate.

The high doping concentration zone which is important for low contact resistance and layer resistances lies in the upper zone of the selective epitaxial layer 4 and therefore outside of the critical zone in the vicinity of the channel. The process can be supplemented by siliciding techniques (application of a metal layer and silicide formation), where the danger of the consumption of silicon, in association with shallow diffusion zones, is avoided since the selective epitaxial layer causes the diffusion zones to be "extended" upwards without impairing the short channel properties. In the siliciding process, due to the monocrystalline nature of the layer, a simple reaction takes place; no reactions with grain boundaries occur, as is the case with polycrystalline silicon.

However, the range of the implantation plus the D.t-load must fulfill the following two limiting conditions:
1. The implantation energy must not be so high that an unusual masking is required; and
2. The necessary D.t-product for a sufficient source or drain to channel overlap, but must not be so high that it changes the existing doping profiles. Therefore, fundamentally one is limited to an epitaxial thickness of a maximum of 400 nm in the MOS field-effect transistor structure with an epitaxial layer doped by implantation following deposition.

Alternatively, the structure can also be produced using a doped epitaxial layer, where a separate n+ and p+ silicon epitaxy into the n and p-channel zones respectively takes place. This results in a homogenous doping of the source/drain zones and an abrupt doping step to the substrate. The anneal direction required for the out-diffusion of the source/drain zones is minimized and the source/drain concentration to the channel zone is simplified. The source/drain implantation, if necessary, then serves merely to reduce the series resistances. As the range of the implantation is no longer critical, the limitation of the epitaxial thickness no longer applies. This results in an additional degree of freedom with respect to the field oxide thickness and the pre-planarisation. This structure and the process for the production thereof is more flexible than the first-mentioned structure process, but requires a silicon dioxide masking step for the separate n+ and p+ epitaxy (see the description below with respect to FIGS. 8–12).

Further details of the formation of these structures will be explained below with reference to two examples (A and B). For both cases the process corresponds to conventional technology, such as is described for example in the European patent applications 0 135 163 and 0 159 617. The source/drain production in accordance with the invention is compatible with different gate materials and gate types (silicides, n+ and p+ polysilicon-metal silicide or polysilicon gate). For clarity, the shading has been omitted from FIGS. 3–12.

EXEMPLARY EMBODIMENT A (with undoped epitaxial layer)

Figure 3:
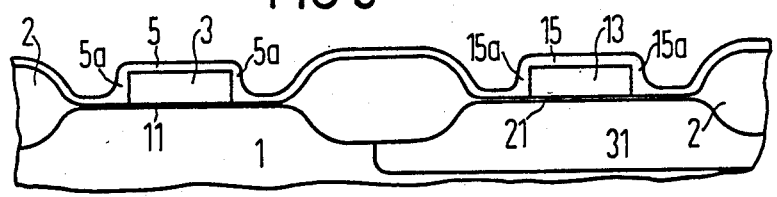
FIGS. 3–7 are each sectional view of the basic process steps for the production of a CMOS-circuit, wherein the doping of the epitaxial layer is carried out following the deposition by ion implantation.

Referring to FIG. 3, a structure is illustrated as obtained when the gate electrodes 3, 13 have been structured on the active transistor zones of the substrate 1 (or n or p wells or trough-like region 31), delimited by the field oxide zones 2. The gate electrodes have been provided with the layers of protective oxide 5, 15 and side-wall oxide 5a, 15a. The gate oxide is referenced 11 and 21, respectively. A reoxidation process is then carried out.

Figure 4:
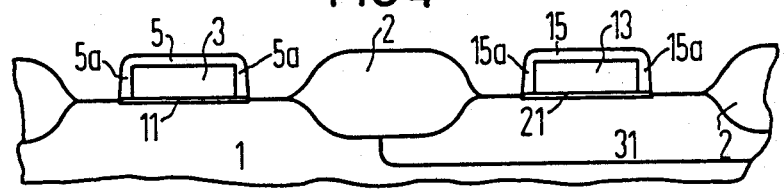

FIG. 4 illustrates the arrangement when the source/drain zones for the following epitaxy have been exposed by anisotropic etching, e.g. by plasma etching in a freon atmosphere (CF$_4$) containing oxygen.

Figure 5:
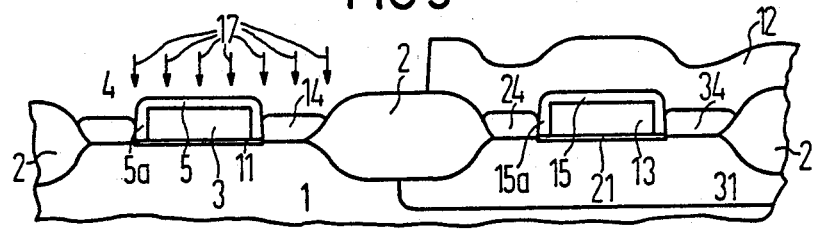

In FIG. 5, and following a short epitaxial preliminary treatment (for example cleansing in organic solvents and flushing in de-ionised water), monocrystalline silicon is now epitaxially deposited in a layer thickness in the range of 300–400 nm without doping. The zones 4, 14, 24, 34 are formed. The gates 3, 13 are covered with oxide 5, 5a, 15, 15a and remain free of silicon, as do the field oxide zones 2. Then the p-channel zones of the circuit, with the gates 13, are covered by a photo-resist mask 12 and a double implantation (indicated by the arrows 17) is carried out to form the n+ source/drain zones 4, 14. In this implantation step, first of all, phosphorus ions are implanted with a dose and energy level of $8 \times 10^{15}$cm$^{-2}$ and 70 KeV, and then 160 KeV. into the layers 4, 14, 24, 34. Following the removal of the photo-resist layer 12, the n-channel zones with gates 3 are now covered with a new photo-resist mask and after the preliminary amorphization of the source/drain zones by a double silicon ion implantation ($2 \times 10^{15}$Si+cm$^{-2}$, 100 KeV and 150 KeV) the source/drain implantation is carried out, in which boron ions are implanted with a dose and energy level of $5 \times 10^{15}$cm$^{-2}$ and 25 KeV followed by 70 KeV. These procedures have not been represented in detail.

Figure 6:
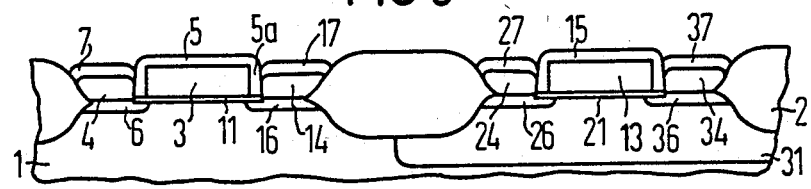

In FIG. 6, an arrangement is shown following the removal of the last-applied photo-resist mask and following the siliciding of the source/drain surfaces (4, 14, 24, 34). In the siliciding process, a metal layer, composed for example of tantalum or titanium, or the corresponding metal silicide, is selectively deposited onto the exposed silicon surfaces. During the following high-temperature step, the silicide layers 7, 17, 27, 37 are formed and as a result of common diffusion of the source/drain zones 4, 14, 24, 34 the source/drain zones 6, 16, 26, 36 are formed. During the high-temperature step, the temperature is set at 900° C.; the duration of the heat treatment amounts to approximately 30 minutes.

Figure 7:
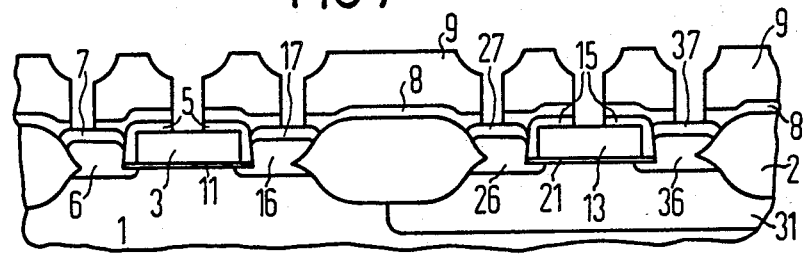

In FIG. 7, the finished CMOS arrangement is illustrated in which, in a manner known per se, the intermediate oxides, in the form of a SiO$_2$ layer 8, produced by the decomposition of tetra-ethyl-orthosilicate (TEOS) in a thickness 100 nm and a boron-phosphorus-silicate glass layer 9, in a thickness 800 nm have been applied and subjected to a flow process at 900° C. for 40 minutes. In these intermediate oxide layers contact holes are then formed by contact hole photo-technique and etching procedures, and the outer conductor path level (10 in FIG. 1), which is composed of aluminum/silicon/titanium, is connected. These process steps are fundamentally know per se and are described in the above-mentioned European patent applications.

EXEMPLARY EMBODIMENT B (with doped epitaxial layer)

In this process, n+ and p+ epitaxial layers are separately formed in accordance with the present invention. In comparison to Exemplary Embodiment A, this variation permits an increase in the thickness of the epitaxial layer and a reduction in the temperature stress.

Referring to FIG. 8, the structure shown in FIG. 3 is again taken as a basis, but in place of the re-oxidation step, a SiO$_2$-deposition 18 is carried out by the thermal decomposition of tetra-ethyl-orthosilicate in a layer thickness of 150 nm.

Referring to FIG. 9, for the masking of the p-channel zones, a photo-resist mask 19 is now applied and the source/drain zones of the n-channel zones are exposed by means of an anisotrophic etching process. The sidewall oxides 5a (spaces) are therefore also formed on the gate electrode 3.

With respect to FIG. 10, following the removal of the photo-resist mask 19 and following the epitaxial preliminary treatment, a selective n+ epitaxial deposition of silicon is carried out in a layer thickness in a range from 300–500 nm. The source/drain zones 4, 14 are formed, which are doped with phosphorus ($10^{19}$cm$^{-3}$).

Referring to FIG. 11, following the oxidation of a 25 nm thick oxide layer 20, a lithographic step is now carried out in order to mask the n-channel zones. The oxide covering the source/drain zones of the p-channels, etched and at the same time the side-wall oxide 15a, is formed. Following the removal of the photo-resist structure and epitaxial preliminary treatment, selected epitaxy p+ (24, 34) is now likewise carried out in the layer thickness in the range of from 300–500 nm using boron as a dopant ($10^{19}$cm$^{-3}$). These steps have not been shown in detail; they are carried out similarly as described with respect to FIGS. 9 and 10. The 25 nm oxide layer 20 on the n-channel zones is removed and the siliciding of the source/drain zones 4, 14, 24, 34 is carried out. The metal silicide layers 7, 17, 27, 37 are therefore formed.

Referring to FIG. 12, the arrangement is completed as described making reference to FIG. 7. As a result of the flow process carried out at 900° for 40 minutes, the dopants (phosphorus, boron) are diffused out of the zones 4, 14, 24, 34 into the substrate 1, whereby the source/drain zones 6, 16, 26, 36 are formed.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A metal-oxide-semiconductor field effect transistor structure, comprising:
   a substrate having a source zone and a drain zone therein at a surface thereof;
   an insulating layer on the substrate between the source and drain zones, and a gate electrode on the insulating layer;
   a sidewall oxide layer covering each side of the gate electrode adjacent one side of the source and drain zones, respectively;
   a field oxide zone in and extending above the substrate at a side opposite said one side of each of the source and drain zones;
   directly above each of the source and drain zones and between and in contact with the gate electrode side oxide layers and the respective field oxide zones a grown monocrystalline doped silicon epitaxial layer being provided serving as a diffusion source from which the respective source or drain zones directly beneath are produced; and
   respective silicide source and drain terminal layers directly overlying and in contact with the respective silicon epitaxial layers, said terminal layers being laterally limited at one side by the respective gate sidewall oxide and at the other side by the respective field oxide zone so that the terminal layers are self-aligned.

2. A structure according to claim 1 wherein each of said monocrystalline doped silicon epitaxial layers has a maximum thickness of 400 nm, and wherein the source or drain zone in the substrate has a doping profile formed by a first doping material and the substrate has a doping profile extending from said source or drain zone formed of a second doping material, and wherein a doping of the silicon epitaxial layers with the first doping material is of a magnitude such that the source or drain zone doping profile diffused from the epitaxial layers does not substantially change said doping profile in the substrate.

3. A structure according to claim 1 wherein said monocrystalline silicon epitaxial layers have a thickness in a range of 300–500 nm, and wherein each of said monocrystalline silicon epitaxial layers has an upper portion which is homogeneously doped to form an abrupt doping step with respect to a doping of the substrate.

4. The structure of claim 1 wherein an insulating layer overlies the transistor structures and a metal contact passes upwardly from each of the respective source and drain silicide terminal layers through the insulating layer.

5. A complementary metal-oxidesemiconductor field effect transistor structure, comprising:
   a substrate having a trough-like region, a first transistor of a first conductivity type being formed in the substrate and a second transistor of a second conductivity type being formed in the trough-like region;
   the first transistor being formed of the substrate having a source zone and a drain zone therein at a surface thereof;
   an insulating layer on the substrate between the source and drain zones, and a gate electrode on the insulating layer;
   a sidewall oxide layer covering each side of the gate electrode adjacent one side of the source and drain zones, respectively;
   a field oxide zone in and extending above the substrate at a side opposite said one side of each of the source and drain zones;
   directly above each of the source and drain zones and between and in contact with the gate electrode sidewall oxide layers and the respective field oxide zones a grown monocrystalline doped silicon epitaxial layer being provided serving as a diffusion source from which the respective source or drain zones directly beneath are produced; and
   respective silicide source and drain terminal layers directly overlying and in contact with the respective silicon epitaxial layers, said terminal layers being laterally limited at one side by the respective gate electrode sidewall oxide layer and at the other side by the respective field oxide zone so that the terminal layers are self-aligned;
   the second transistor being formed of the trough-like region having a source zone and a drain zone therein at a surface thereof;
   an insulating layer on the island region between the source and drain zones, and a gate electrode on the insulating layer;
   a sidewall oxide layer covering each side of the gate electrode adjacent one side of the source and drain zones, respectively;
   a field oxide zone in and extending above the trough-like region at a side opposite said one side of each of the substrate and drain zones;
   directly above each of the source and drain zones and between and in contact with and in contact with the gate electrode sidewall oxide layers and the respective field oxide zones a grown monocrystalline doped silicon epitaxial layer being provided serving as a diffusion source from which the respective source or drain zones directly beneath are produced; and
   respective silicide source and drain terminal layers directly overlying and in contact with the respective silicon epitaxial layers, said terminal layers being laterally limited at one side by the respective gate electrode sidewall oxide and at the other side by the respective field oxide zone so that the terminal layers are self-aligned.

* * * * *